United States Patent
Barbosa

(10) Patent No.: US 12,289,850 B2
(45) Date of Patent: Apr. 29, 2025

(54) MODULAR ELECTRICAL EQUIPMENT STORAGE ASSEMBLY

(71) Applicant: Gary Barbosa, Palm Harbor, FL (US)

(72) Inventor: Gary Barbosa, Palm Harbor, FL (US)

( * ) Notice: Subject to any disclaimer, the term of this patent is extended or adjusted under 35 U.S.C. 154(b) by 286 days.

(21) Appl. No.: 17/671,120

(22) Filed: Feb. 14, 2022

(65) Prior Publication Data

US 2022/0264757 A1     Aug. 18, 2022

Related U.S. Application Data

(60) Provisional application No. 63/148,902, filed on Feb. 12, 2021.

(51) Int. Cl.
   *H05K 5/06*     (2006.01)
   *H05K 5/02*     (2006.01)

(52) U.S. Cl.
   CPC ............. *H05K 5/06* (2013.01); *H05K 5/0204* (2013.01); *H05K 5/0221* (2013.01); *H05K 5/023* (2013.01)

(58) Field of Classification Search
   CPC ...... H05K 5/06; H05K 5/0204; H05K 5/0221; H05K 5/023; Y10S 248/906; H01Q 1/246; H01Q 1/128
   USPC .... 312/108, 100, 111, 198, 223.1, 258, 262; 174/45 R, 58; 343/890, 878, 892; 248/218.4, 219.1, 219.3
   See application file for complete search history.

(56) References Cited

U.S. PATENT DOCUMENTS

| | | | | |
|---|---|---|---|---|
| 2,583,931 | A | * | 1/1952 | Cummings ............ A47B 43/02 108/162 |
| 4,265,501 | A | * | 5/1981 | Halliburton ............ A47B 43/00 312/258 |
| 5,165,770 | A | | 11/1992 | Hahn |
| 5,467,955 | A | * | 11/1995 | Beyersmith .......... H01Q 1/1242 343/890 |
| 6,788,535 | B2 | | 9/2004 | Dodgen et al. |
| 6,969,034 | B2 | * | 11/2005 | Ware ....................... H01G 2/04 248/230.9 |

(Continued)

FOREIGN PATENT DOCUMENTS

CN     111799541 A  * 10/2020 ........... H01Q 1/1207

*Primary Examiner* — Janet M Wilkens
(74) *Attorney, Agent, or Firm* — Law Office of Vincent LoTempio PLLC; Vincent G. LoTempio; Robert L. Cerasa

(57) ABSTRACT

A modular electrical equipment storage assembly utilizes multiple weatherproof enclosures that store electronic or non-electronic equipment. Enclosures have modular configurations that enables enclosures to detachably attach to each other in multiple arrangements and in series. Enclosures also mount to a vertical pole while attached to each other, or in spaced-apart arrangements. Enclosures detachably attach in: a two-sided, three-sided, four-sided or multi-sided modular arrangement, in which any wall of any enclosure can join to an adjacent wall, or pole. Enclosures have a three-sided mounting surface, right and left sidewalls, and a three-sided front, top and bottom panel. The mounting surface has multiple mount holes and fastening holes that enable passage of fastening mechanisms for mounting enclosures to each other and/or pole. Mount holes and inter-connection apertures can be mirrored to enable enclosures to attach in a geometric configuration. Two three-sided assemblies complement each other to form a weatherproof, six-sided enclosure.

10 Claims, 11 Drawing Sheets

(56) References Cited

U.S. PATENT DOCUMENTS

| | | | |
|---|---|---|---|
| 6,999,597 B2* | 2/2006 | Yang | H04R 1/02 |
| | | | 381/386 |
| 7,059,572 B2 | 6/2006 | Ware et al. | |
| 7,106,273 B1* | 9/2006 | Brunson | H01Q 1/246 |
| | | | 343/890 |
| 7,379,305 B2 | 5/2008 | Briggs et al. | |
| 7,643,291 B2 | 1/2010 | Mallia et al. | |
| 8,035,029 B2* | 10/2011 | Mullen | H05K 5/069 |
| | | | 174/64 |
| 8,633,614 B2 | 2/2014 | Larsson | |
| 8,887,944 B2 | 11/2014 | Deane et al. | |
| 8,950,723 B1* | 2/2015 | Fogelstrom | A45B 11/00 |
| | | | 248/524 |
| 9,595,704 B2 | 3/2017 | Tiefenbach et al. | |
| 9,985,422 B2* | 5/2018 | Jett | H02B 1/50 |
| 10,971,794 B2* | 4/2021 | Smith | H01Q 1/1228 |
| 11,677,144 B1* | 6/2023 | Lafleur | H01Q 21/26 |
| | | | 343/878 |
| 2002/0121847 A1* | 9/2002 | Christner | H04R 1/026 |
| | | | 248/323 |
| 2004/0035602 A1* | 2/2004 | White | H02G 3/32 |
| | | | 174/58 |
| 2009/0073662 A1 | 3/2009 | Dahl | |
| 2023/0013649 A1* | 1/2023 | Colapietro | H01Q 1/246 |

\* cited by examiner

902

| | Cabinet 102 c & d ← 904a | | | Cabinet 102 e & f ← 904b | | |
|---|---|---|---|---|---|---|
| Diameter (Inches) | Width (Dia /2 + 56) | Height | Depth | Width (Dia x 1) | Height | Depth |
| 96 | 104 | 24 | 24 | 96 | 48 | 24 |
| 94 | 103 | 24 | 24 | 94 | 48 | 24 |
| 92 | 102 | 24 | 24 | 92 | 48 | 24 |
| 90 | 101 | 24 | 24 | 90 | 48 | 24 |
| 88 | 100 | 24 | 24 | 88 | 48 | 24 |
| 86 | 99 | 24 | 24 | 86 | 48 | 24 |
| 84 | 98 | 24 | 24 | 84 | 48 | 24 |
| 82 | 97 | 24 | 24 | 82 | 48 | 24 |
| 80 | 96 | 24 | 24 | 80 | 48 | 24 |
| 78 | 95 | 24 | 24 | 78 | 48 | 24 |
| 76 | 94 | 24 | 24 | 76 | 48 | 24 |
| 74 | 93 | 24 | 24 | 74 | 48 | 24 |
| 72 | 92 | 24 | 24 | 72 | 48 | 24 |
| 70 | 91 | 24 | 24 | 70 | 48 | 24 |
| 68 | 90 | 24 | 24 | 68 | 48 | 24 |
| 66 | 89 | 24 | 24 | 66 | 48 | 24 |
| 64 | 88 | 24 | 24 | 64 | 48 | 24 |
| 62 | 87 | 24 | 24 | 62 | 48 | 24 |
| 60 | 86 | 24 | 24 | 60 | 48 | 24 |
| 58 | 85 | 24 | 24 | 58 | 48 | 24 |
| 56 | 84 | 24 | 24 | 56 | 48 | 24 |
| 54 | 83 | 24 | 24 | 54 | 48 | 24 |
| 52 | 82 | 24 | 24 | 52 | 48 | 24 |
| 50 | 81 | 24 | 24 | 50 | 48 | 24 |
| 48 | 80 | 24 | 24 | 48 | 48 | 24 |
| 46 | 79 | 24 | 24 | 46 | 48 | 24 |
| 44 | 78 | 24 | 24 | 44 | 48 | 24 |
| 42 | 77 | 24 | 24 | 42 | 48 | 24 |
| 40 | 76 | 24 | 24 | 40 | 48 | 24 |
| 38 | 75 | 24 | 24 | 38 | 48 | 24 |
| 36 | 74 | 24 | 24 | 36 | 48 | 24 |
| 34 | 73 | 24 | 24 | 34 | 48 | 24 |
| 32 | 72 | 24 | 24 | 32 | 48 | 24 |
| 30 | 71 | 24 | 24 | 30 | 48 | 24 |
| 28 | 70 | 24 | 24 | 28 | 48 | 24 |
| 26 | 69 | 24 | 24 | 26 | 48 | 24 |
| 24 | 68 | 24 | 24 | 24 | 48 | 24 |
| 22 | 67 | 24 | 24 | 22 | 48 | 24 |
| 20 | 66 | 24 | 24 | 20 | 48 | 24 |
| 18 | 65 | 24 | 24 | 18 | 48 | 24 |
| 16 | 64 | 24 | 24 | 16 | 48 | 24 |
| 14 | 63 | 24 | 24 | 14 | 48 | 24 |
| 12 | 62 | 24 | 24 | 12 | 48 | 24 |
| 10 | 61 | 24 | 24 | 10 | 48 | 24 |

FIG. 9A

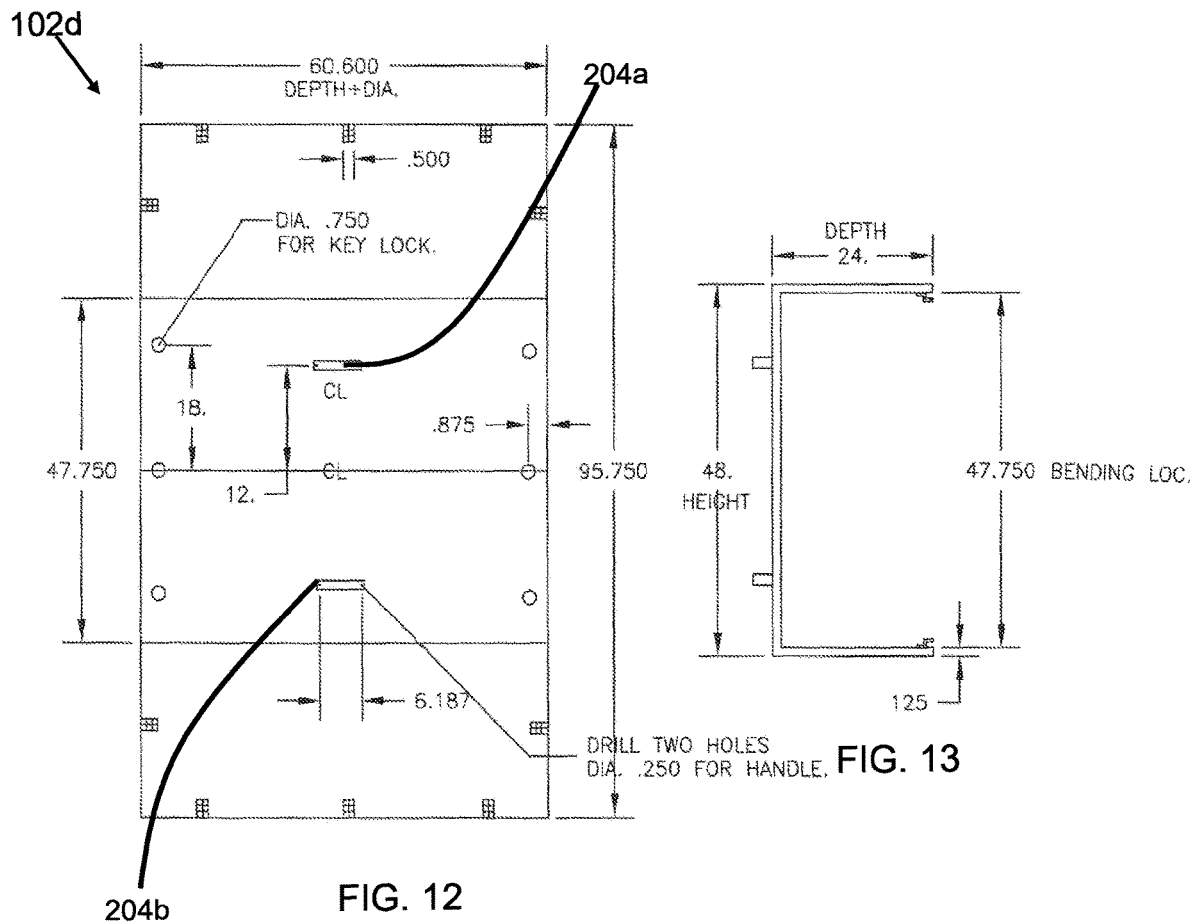
FIG. 12
FIG. 13
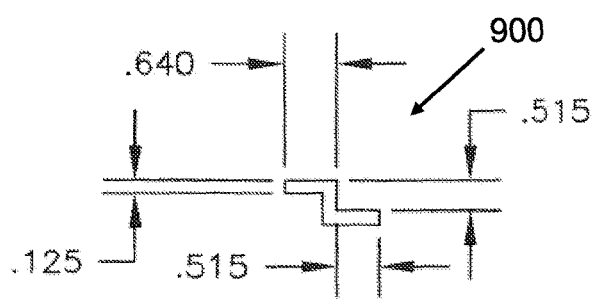
FIG. 14

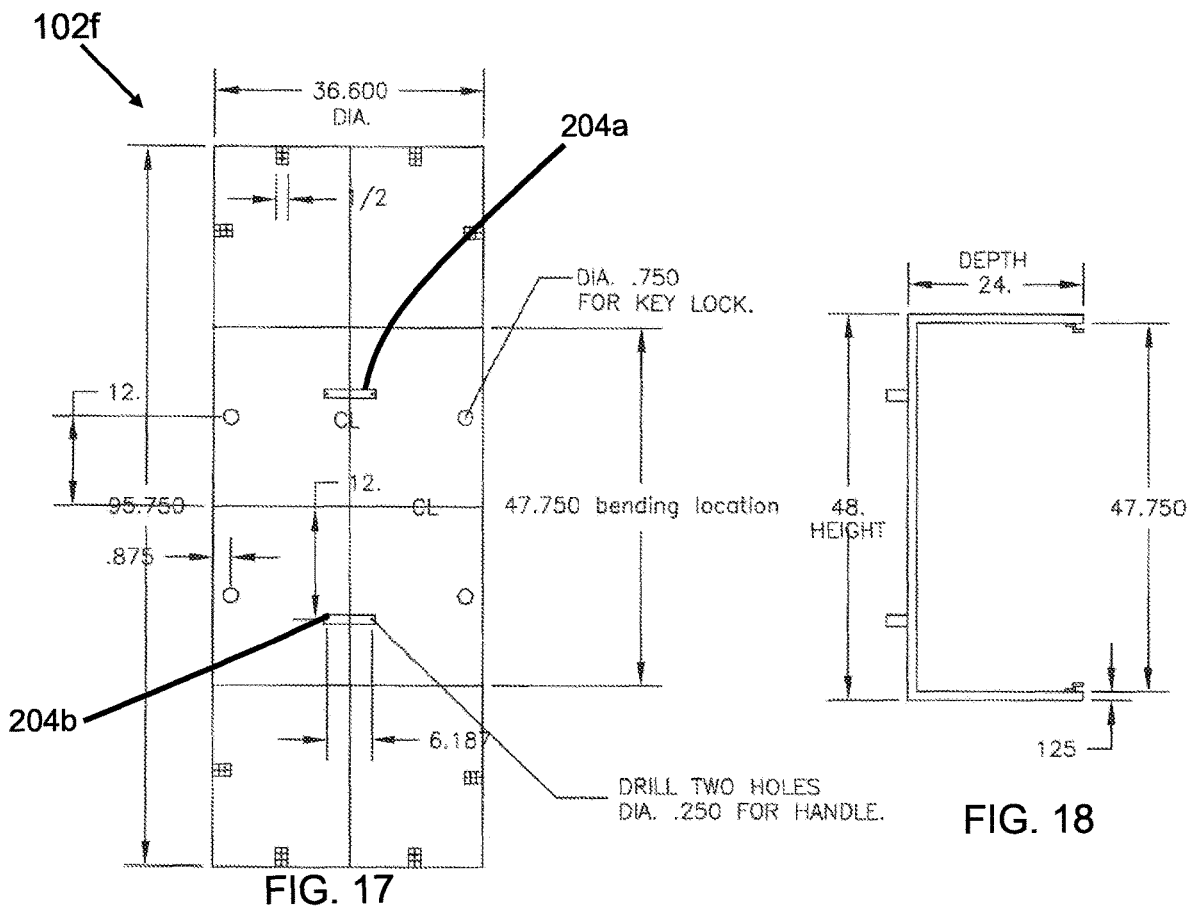
FIG. 17
FIG. 18
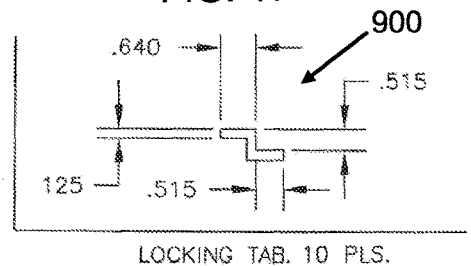
FIG. 19

MODULAR ELECTRICAL EQUIPMENT STORAGE ASSEMBLY

RELATED APPLICATIONS

This application claims the benefit of U.S. provisional application No. 63,148,902 filed Feb. 12, 2021 and entitled MODULAR ELECTRICAL EQUIPMENT STORAGE ASSEMBLY, which provisional application is incorporated by reference herein in its entirety.

FIELD OF THE INVENTION

The present invention relates generally to a modular electrical equipment storage assembly. More so, the storage assembly provides multiple weatherproof enclosures that have a modular configuration that enables the enclosures to detachably attach to each other in geometric arrangements and in series. The enclosures can also mount to vertical poles or columns of varying diameters. Mount holes and interconnection apertures in the walls are arranged in a mirror disposition, so as to allow adjacent walls to align easily and fasten. The type of material and tolerances chosen permit ease of use and installation in the field, while enabling the subject equipment to be secured directly to and inside the storage assemblies. The enclosures are sized and dimensioned to store electronic or non-electronic equipment, or other weather sensitive equipment.

BRIEF DESCRIPTION OF THE DRAWINGS

The invention will now be described, by way of example, with reference to the accompanying drawings.

FIG. 5 (102b) illustrates a view of the front cover, top and bottom comprising three sides of the enclosure that compliments and completes 102a, showing the handles (204a-b) and locations of six (6) Key Locks and ten (10) locking tabs which dove tail with the guide rails (102a, 200a-d) which serve to secure 102b to 102a.

FIG. 6 illustrates side view of the front cover, top and bottom comprising three of the enclosure that compliments and completes 102a, showing the handles and locking tabs that dove tail with the guide rails securing 102b to 102a.

FIG. 7 illustrates the details of the locking tabs, which dove tail with the guide rails (102a, 200a-d) which serve to secure 102b to 102a.

FIG. 9A illustrates a table of possible configurations of enclosures 102c-102d and enclosure 102e-102f, noting that the height, depth and width of the enclosures will be governed by the equipment to be stored and the various diameters of the poles or columns upon which said enclosures would need to be mounted, in accordance with an embodiment of the present invention;

FIG. 12 (102d) illustrates a view of the front cover, top and bottom comprising three sides of the enclosure that compliments and completes 102c, showing the handles, locations of six (6) Key Locks and ten (10) locking tabs, which dove tail with the guide rails on 102c which serve to secure 102d to 102c.

FIG. 13 illustrates side view of the front cover, top and bottom comprising three sides of the enclosure that compliments and completes 102c, showing the handles and locking tabs that dove tail with the guide rails securing 102d to 102c.

FIG. 14 illustrates the details of the locking tabs, which dove tail with the guide rails on 102c which serve to secure 102d to 102c.

FIG. 17 (102f) illustrates a view of the front cover, top and bottom comprising three sides of the enclosure that compliments and completes 102e, showing the handles (204a-b) and locations of four (4) Key Locks and eight (8) locking tabs, which dove tail with the guide rails on 102e, which serve to secure 102f to 102e, in accordance with an embodiment of the present invention;

FIG. 18 illustrates a side view of the front cover, top and bottom comprising three sides of the enclosure that compliments and completes 102e, showing the handles and locking tabs that dove tail with the guide rails securing 102f to 102e, in accordance with an embodiment of the present invention; and FIG. 19 illustrates the details of the locking tabs, which dove tail with the guide rails on 102e, which serve to secure 102f to 102e, in accordance with an embodiment of the present invention.

DETAILED DESCRIPTION OF THE INVENTION

Figure 1:
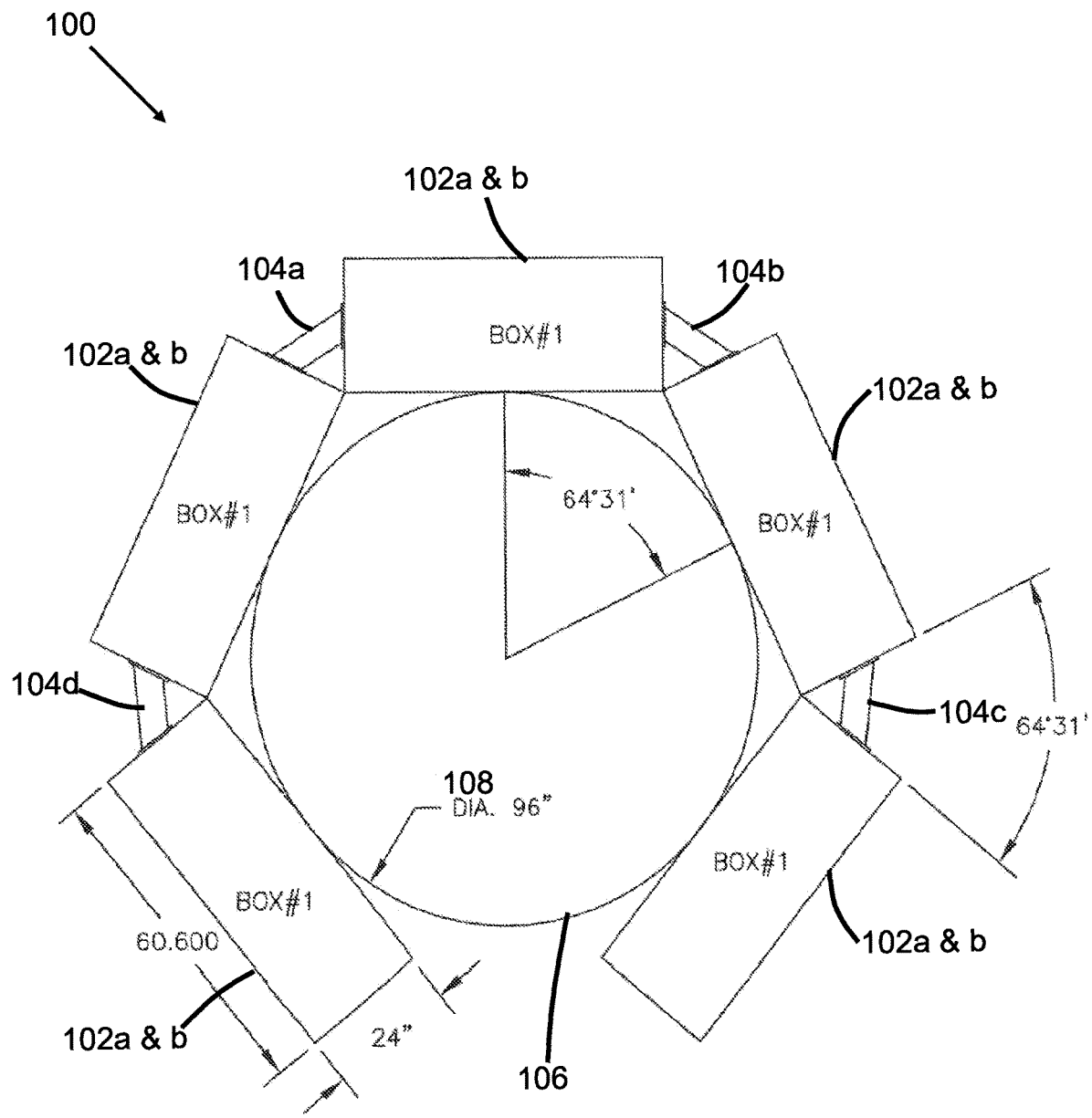
FIG. 1 (100) illustrates a top view of an exemplary modular electrical equipment storage assembly for large diameter columns or poles, showing five enclosures (102a & b) fastened directly to and around a pole or column (106, 108), stabilizer and wire connection units (104a-d) in accordance with an embodiment of the present invention.
Figure 2:
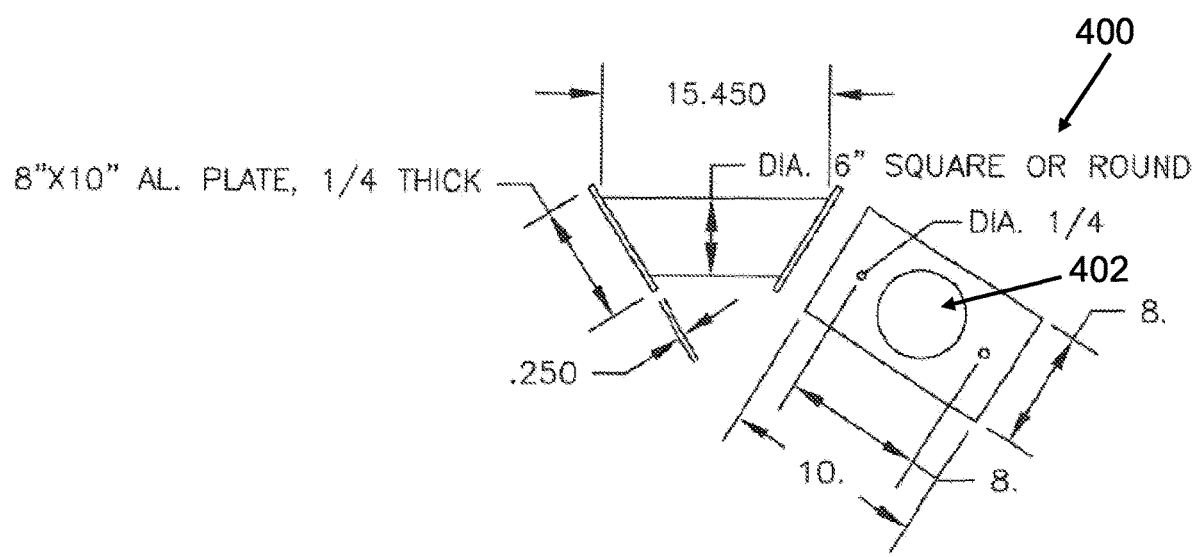
FIG. 2, 400, illustrates a detailed view of the embodiment for an enclosure with an exemplary stabilizer plate and wire connection unit for large diameter columns or poles, in accordance with an embodiment of the present invention.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "mounting surface," "top," "left," "bottom," "right," "front," "vertical," "horizontal," "column," "pole," "guide rails," "locking tabs," and "key lock," derivatives thereof shall relate to the invention as oriented in FIG. 1, FIG. 8, and FIG. 9. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

At the outset, it should be clearly understood that like reference numerals are intended to identify the same structural elements, portions, or surfaces consistently throughout the several drawing figures, as may be further described or explained by the entire written specification of which this detailed description is an integral part. The drawings are intended to be read together with the specification and are to be construed as a portion of the entire "written description" of this invention as required by 35 U.S.C. § 112.

In one embodiment of the present invention presented in FIGS. 1-7, a modular electrical equipment storage assembly 100 utilizes multiple weatherproof enclosures 102a, 102b, that are sized and dimensioned to store electronic and non-electronic equipment, or other weather sensitive equipment. As FIG. 1 illustrates, enclosures 102a, 102b, have a modular configuration that enables the enclosures 102a, 102b, to detachably attach to each other in a variety of geometric arrangements, and in series. Enclosures 102a, 102b, can also mount to a vertical pole/column 106 while attached to each other, or in a spaced-apart geometric arrangement. In some embodiments, enclosures 102a, 102b, detachably attach to each other, and/or to the pole/column 106 in either: a two-sided, three-sided, four-sided or five-sided modular arrangement, in which any wall of any enclosure can join to an adjacent enclosure or the pole/column. Said enclosures can also be stacked vertically in continuous fashion until the desired square footage of storage is achieved.

In other embodiments, enclosures 102a, 102c, and 102e are defined by a mounting surface (300), right and left sidewalls, and guide rails. Any one of the walls may have multiple mount holes 201a-d and pass through inter-connecting apertures 202a-d and 204a-204b, that are sized to enable passage of wires and cables to and from electronic or non-electronic equipment; a fastening mechanism used to mount the enclosures 102a, 102c, and 102e to each other and/or the pole or column 106 or 108. Inter-connecting apertures, 202a-d and 204a-204b, can be mirrored, or aligned, so as to enable enclosures 102a, 102c and 102e, to easily attach together in a geometric modular configuration.

Further, the modular design of these six-sided enclosures [102a-102b], [102c-102d], [102e-102f], enables stacking the enclosures 102a, 102c, and 102e, along any diameter, one atop another, in order to reach a desired square footage of storage. The thickness of the rear wall 300 provides sufficient structural integrity, such that one enclosure attaches to adjacent enclosures 102a, 102c, and 102e, or mounts to the pole 106 or 108 with self-taping screws, rivets, etc. Mount holes 201a-d in the rear wall 300 also enable the enclosures 102a, 102c, and 102e to mount around a circumference of a pole or column 106 or 108 in a two-sided, three-sided, four-sided, or five-sided arrangement, creating one continuous inter-connected space.

In one aspect of the present invention, a modular equipment storage assembly 100 comprises:

Multiple weatherproof enclosures defined by a mounting surface 300, right and left side walls, and guide rails 200a-d. The mounting surface 300, has multiple mount holes 201a-d, the inter-connecting holes 204a-b are configured in a mirror arrangement on the right and left sides. The front cover, top and bottom 102b, comprising three sides of the enclosure that compliments and completes 102a, showing the handles (204a-b) and locations of six (6) Key Locks and ten (10) locking tabs which dove tail with the guide rails on 102a which serve to secure 102b to 102a.

In a second aspect, the enclosures 102a, 102c, and 102e, have a rectangular shape.

In another aspect, the rear wall 300 has a threshold thickness for structural integrity.

In another aspect, the fastening mechanism comprises a self-taping screw.

In another aspect, the enclosure has a length of 60.22" and a width of 24".

In another aspect, the fastening holes are defined by a diameter of 0.25" sized to attach a handle to the walls.

In another aspect, the assembly 100 comprises at least one connecting member 104a-d joined to the sidewalls of adjacent, spaced-apart enclosures.

In another aspect, the assembly comprises a mounting surface 300.

In another aspect, the assembly 100 comprises a stabilizer and wire connection unit 400.

In another aspect, the enclosures 102b, 102d and 102f comprise locking tabs 900.

One objective of the present invention is to create an assembly 100 and 500 of weatherproof enclosures [102a-102b], [102c-102d], [102e-102f], that attach to each other in a geometric arrangement, as well as to a central pole 106, 108, column, or wall.

Another objective is to provide an enclosure that does not permit water or debris to enter for containing electrical complements.

Yet another objective is to design the inter-connecting holes 202a-d and 204a-204b, in a mirror configuration that allows the mounting surface 300 and side walls to align for mounting together.

An exemplary objective is to provide an inexpensive to manufacture modular electrical equipment storage assembly 100 and 500, and having a reasonably light weight which permits ease of use when installing these assemblies in the field.

Additional objectives are to provide a modular equipment storage assembly 100 and 500 that is easily assembled in multiple geometric arrangements.

As referenced in FIG. 1, assembly 100 comprises multiple weatherproof enclosure that is used to contain electrical or non-electrical equipment, or other weather sensitive equipment. In one non-limiting embodiment, the enclosures 102a-102b, have a rectangular shape. However, in other embodiments, enclosures 102a-102b, can have a cubicle, spherical, or irregular shape. In any matter, the enclosure has sufficient space to contain electrical equipment, such as wires, routers, circuits, and the like. Suitable materials for enclosures may include, without limitation, aluminum, stainless steel, metal alloys, iron, and a rigid polymer.

Figure 3:
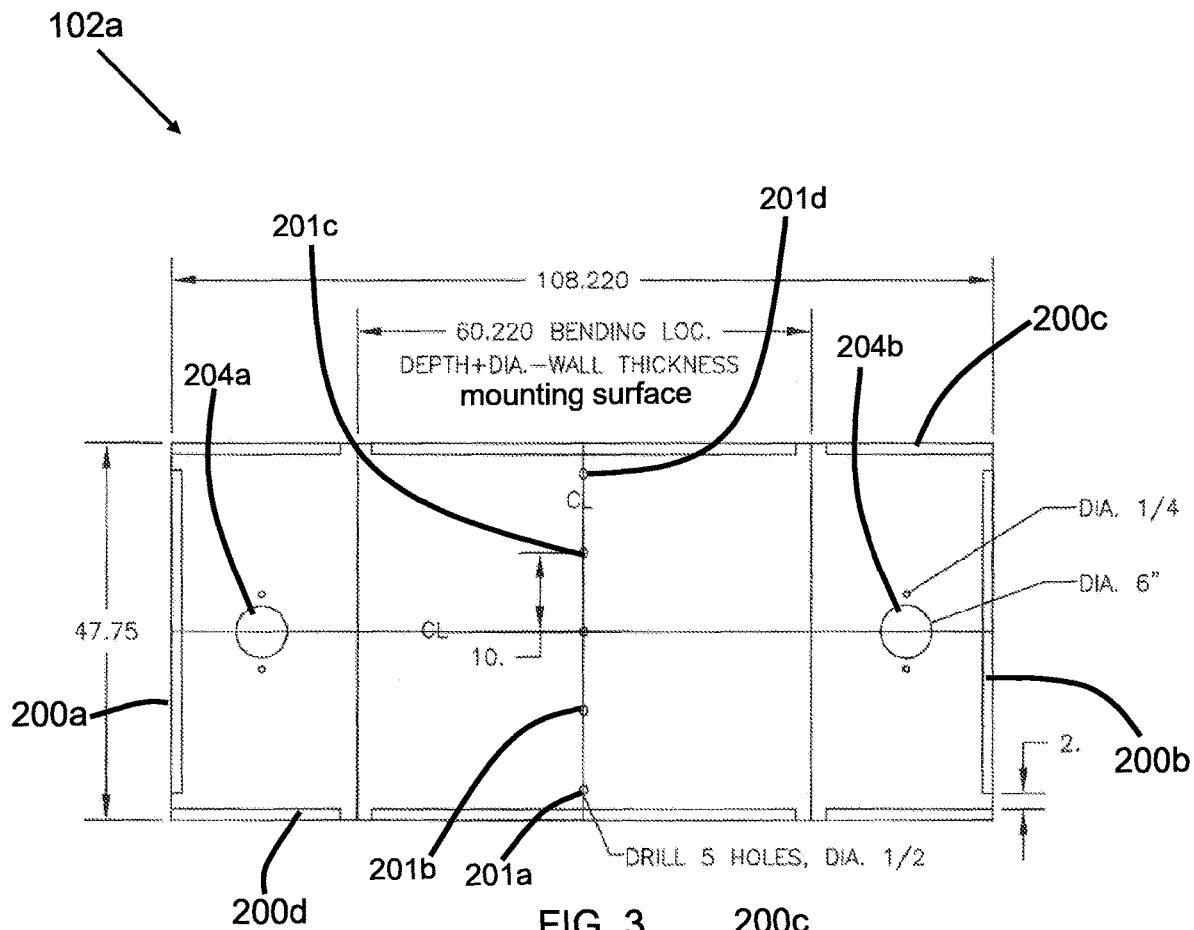
FIG. 3 (102a) illustrates a three-sided base cabinet and the guide rails (200a-d) around the perimeter of a first embodiment of an exemplary enclosure comprising the mounting surface having mounting holes (201a-d), right and left side walls with connecting portals (204a & b) for the modular equipment storage assembly, in accordance with an embodiment of the present invention.
Figure 4:
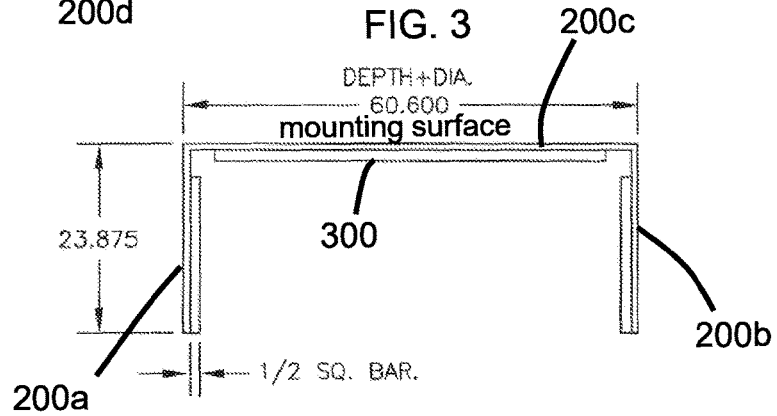
FIG. 4 illustrates a top view of a first embodiment of the mounting surface 300, right and left side walls, and the guide rails (200a-c) for the enclosure, in accordance with an embodiment of the present invention.

As shown in FIG. 3, enclosures 102a is defined by a mounting surface 300 that forms the rear wall of the enclosure that faces away from a user who is accessing the interior of the enclosure, as well as right and left side. The walls define a cavity that is sized and dimensioned to contain electrical and weather sensitive equipment.

In some embodiments, guide rails 200a-d, are tack welded to the mounting surface and to the right and left side walls to provide rigidity to the enclosures and a primary means of attaching and locking 102b, 102d and 102f to 102a, 102c, and 102e. In one non-limiting embodiment, enclosure has a length of 60.6" and a width of 24" (See FIGS. 3 and 4). Walls are designed to restrict entry of moisture and debris into the interior cavity. In some embodiments, the mounting surface 300 hingedly joins with the right and left side walls.

Looking to FIGS. 3-4, 10-11 and 15-16, these three-sided enclosures comprise the mounting surface, right and left sides, to compliment and complete respectively the three-sided enclosures FIG. 5-6, 12-13, 17-18 front panel, top and bottom sides to achieve a six-sided enclosure. In some embodiments, the mounting surface AKA "rear wall" 300 has a threshold thickness for structural integrity. This ensures sufficient structural integrity to fasten to adjacent right and left walls. In some embodiments, notably enclosures 102a, 102c and 102e, have guide rails 200a-d, which are attached perpendicular leading edge of the enclosures to provide structural rigidity and a point of attachment for the locking tabs and key locks to secure 102b, 102d, and 102f, to 102a, 102c and 102e.

All components noted herein can be constructed of metal or a rigid polymer. Assembly 100 may also include a stabilizer and wire connection unit 400 that organizes wires and electrical equipment. Stabilizer and wire connection unit 400 may include a flat plate with at least one wire opening 402 that enable passage of wires therethrough.

Figure 8:
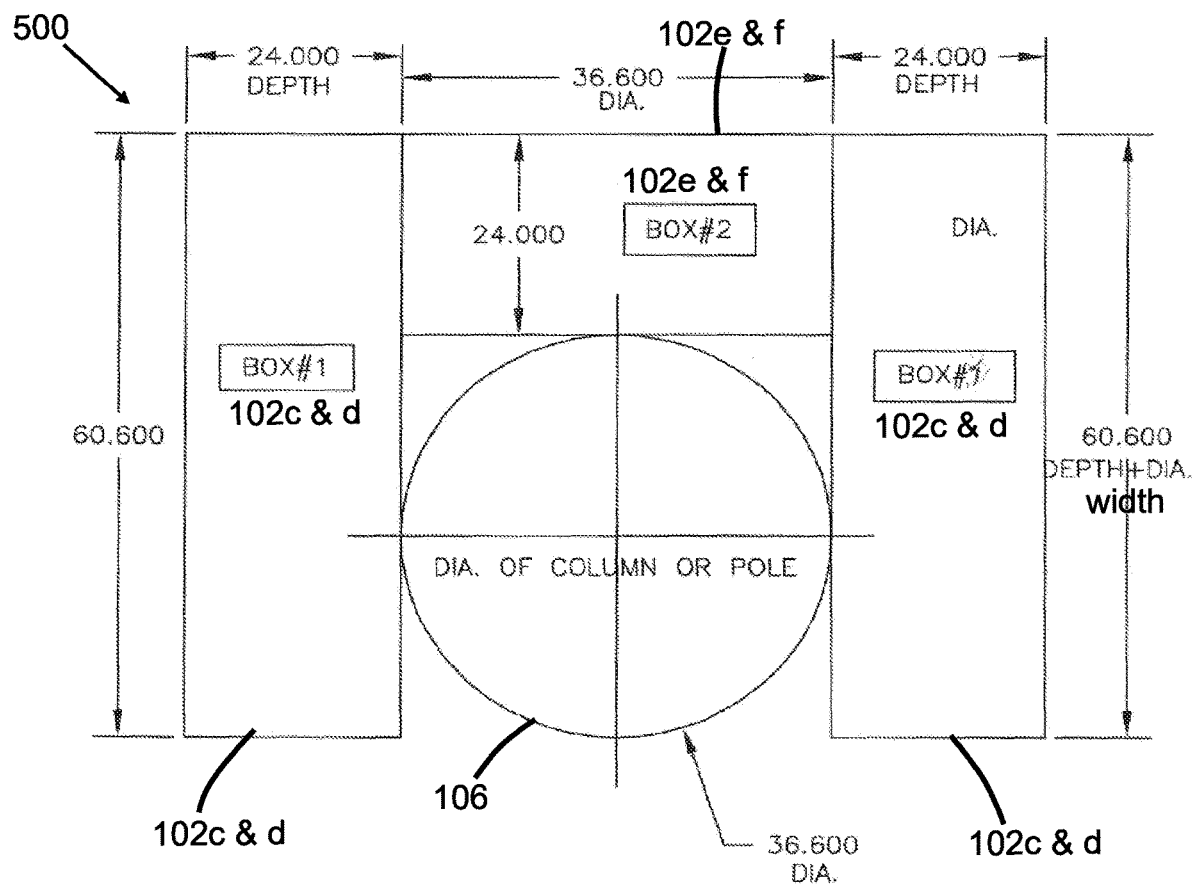
FIG. 8 illustrates a top view of an exemplary modular equipment storage assembly for smaller diameter columns or poles, showing three enclosures of two different sizes (102c & d, 102e & f) fastened directly to and around a pole or column (106), in accordance with an embodiment of the present invention.
Figure 9:
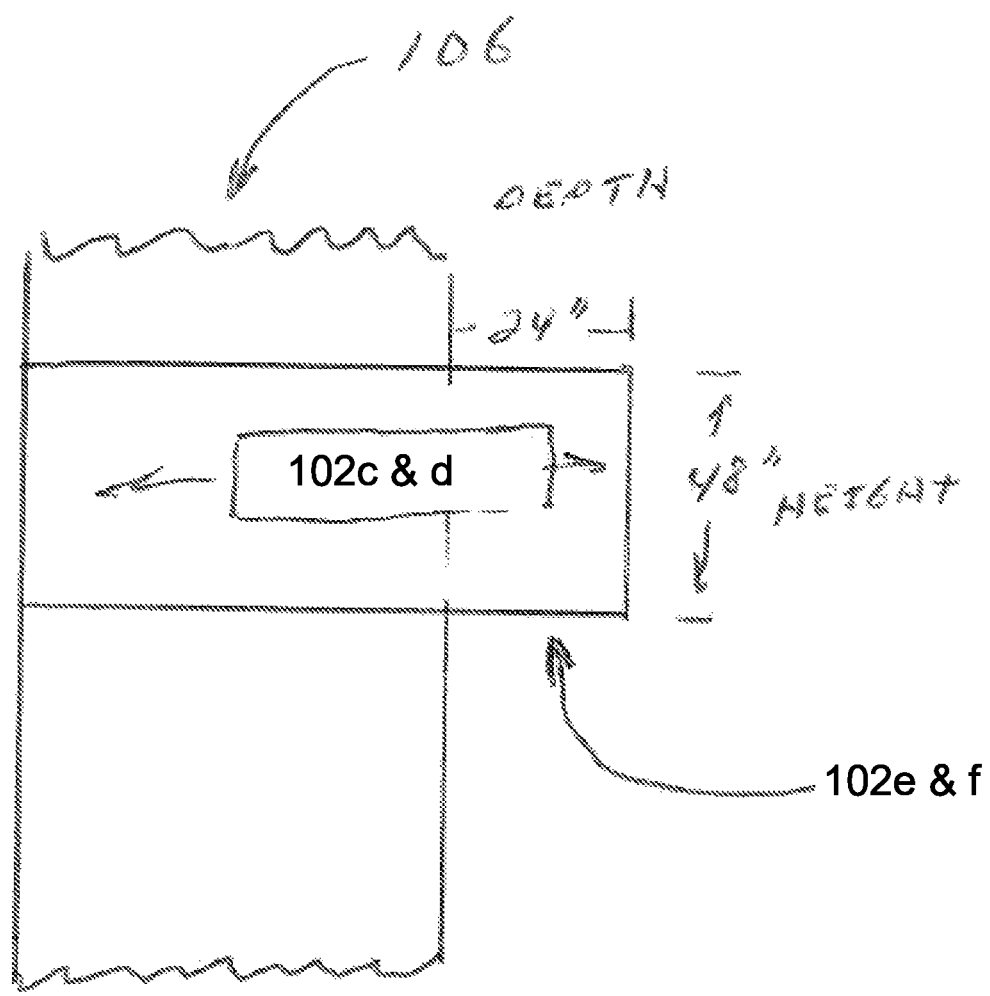
FIG. 9 illustrates a side view of exemplary enclosures (102c & d, 102e & f), around a column or pole (106) in accordance with an embodiment of the present invention.

Looking at FIG. 8, enclosures [102c-102d], and [102e-102f], detachably attach to each other in a modular arrangement. This can include a stacked arrangement of a two-sided, three-sided, and a four-sided arrangement. For example, two enclosures [102c-102d], and one [102e-102f], can be joined and then stacked on top of each other with the bottom wall of the upper enclosure resting on the top wall of the bottom enclosure, resulting in six enclosures stacked three above three. In another example, multiple enclosures of two [102c-102d] enclosures, and two [102e-102f] enclosures, can be fastened together in continuous relationship, forming full enclosure of a column or pole, where four enclosures are stacked above four enclosures continuously until the desired storage capacity is achieved.

However, myriad combinations of enclosure arrangements may also be utilized. In other embodiments, the enclosures 102a, 102b, detachably attach to a vertical pole 106, column, wall, or electrical structure. For example, FIG. 1 illustrates a top view of an exemplary modular electrical equipment storage assembly 100, showing five enclosures 102a, 102b, fastened around a pole 106. In yet another embodiment, the enclosures 102a, 102b, detachably attach to each other, and to the pole 106, simultaneously. In another example, FIG. 8 shows an arrangement of enclosures that have three enclosures, two 102c, 102d, and one 102e, 102f, fastened to the pole/column 106.

FIG. 9A illustrates a table 902 of possible size dimensions 904a for enclosures 102c-102d and size dimensions 904b for enclosure 102e-102f, noting that the height, depth and width of the enclosures will be governed by the equipment to be stored and the various diameters of the poles or columns upon which said enclosures would need to be mounted. For example, a cabinet 102c can have a diameter of 96", a width of 104", and a depth of 24". A cabinet 102e can have a diameter of 96", a width of 48", and a depth of 24". However, it is significant to note that the cabinets and enclosures can have greater or lesser sizes, as the present invention is scalable.

It is significant to note that enclosures fasten to poles/columns of various diameters 106/108 or as exemplified in FIG. 9A. In one non-limiting embodiment, diameter of pole is 96". Though other diameters can be used to support enclosures therearound. However, in other embodiments, at least one connecting member 104a, 104b, 104c, 104d joins the sidewalls, creating an arrangement of adjacent, spaced-apart enclosures. In one non-limiting embodiment, connecting member 104a-d is an elongated cylindrical rod.

Figure 10:
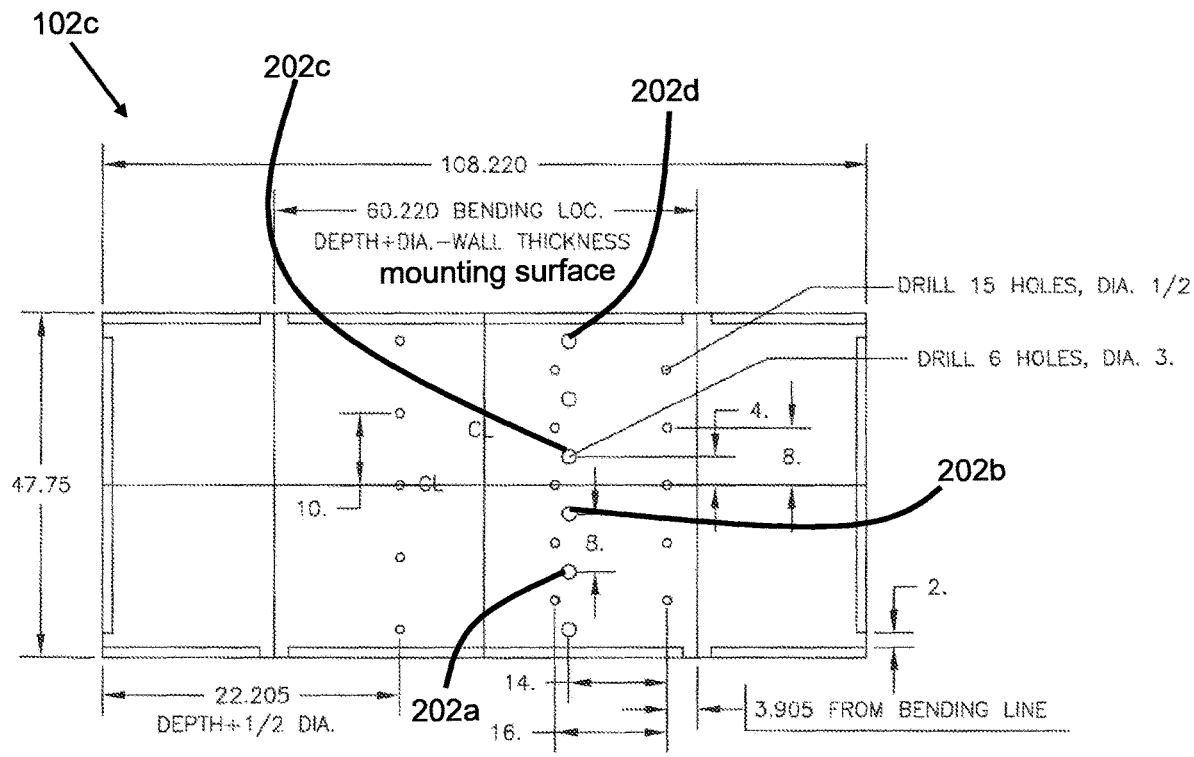
FIG. 10 (102c) illustrates a three-sided base cabinet, the guide rails and connecting holes of a first embodiment of an exemplary enclosure comprising the mounting surface, right and left side walls with connecting portals (202a-d) for the modular equipment storage assembly, in accordance with an embodiment of the present invention.
Figure 11:
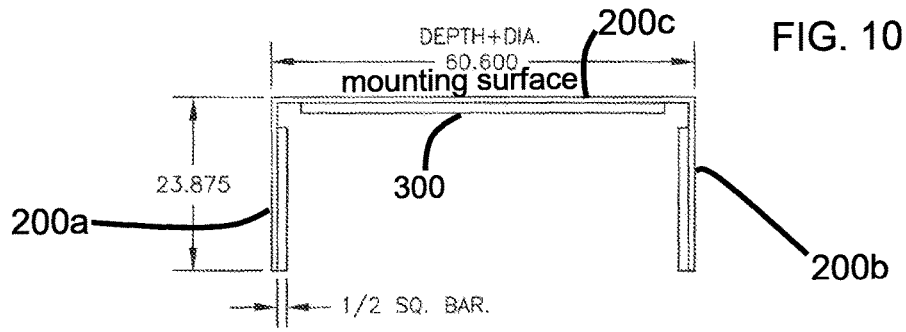
FIG. 11 illustrates a top view of a first embodiment of the mounting surface 300, right and left side walls, and the guide rails (200a-c). for the enclosure, in accordance with an embodiment of the present invention.
Figure 15:
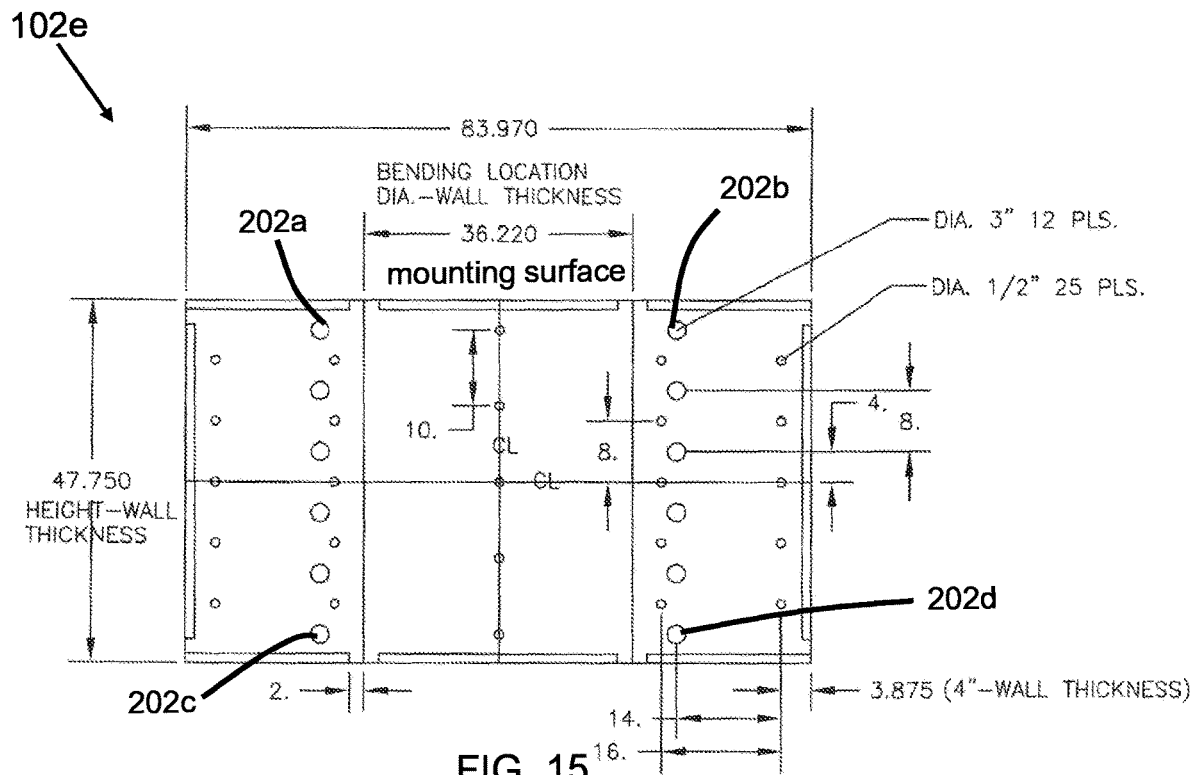
FIG. 15 (102e) illustrates a three-sided base cabinet, the guide rails and connecting holes in the right and left side walls, which are mirrored in 102c. of a first embodiment of an exemplary enclosure comprising the mounting surface, right and left side walls with connecting portals for the modular equipment storage assembly, in accordance with an embodiment of the present invention.
Figure 16:
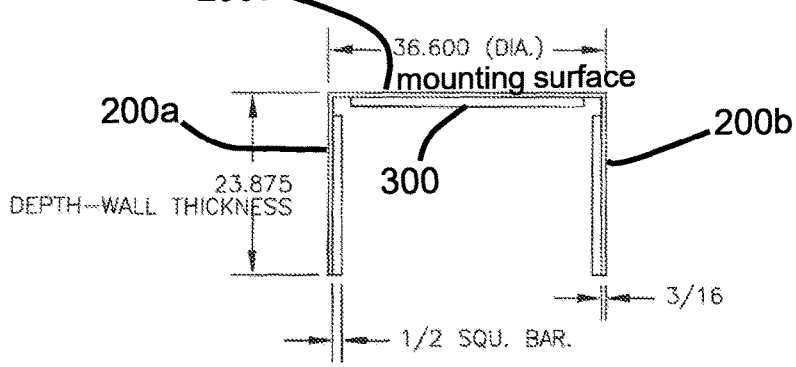
FIG. 16 illustrates a top view of a first embodiment of the mounting surface 300, right and left side walls, and the guide rails (200a-c). for the enclosure, in accordance with an embodiment of the present invention.

As FIG. 3, FIG. 10 and FIG. 15 reference, the mounting surface, where multiple mount holes 201a-d and interconnection apertures 202a-d are configured in a mirror arrangement on the one side and mounting surface 300, such that each enclosure has similarly arranged mount holes 202a-d. In one embodiment, FIG. 15, the right and left side walls of 102e have multiple mounting and inter-connection apertures, that are mirrored in 102c. Fastening mechanism may include a self-taping screw. However, in other embodiments, other types of fastening mechanisms may be used, including without limitation, a bolt, a screw, a nail, a magnet, a weld, rivet and an adhesive.

Figures 5, 6, 7:
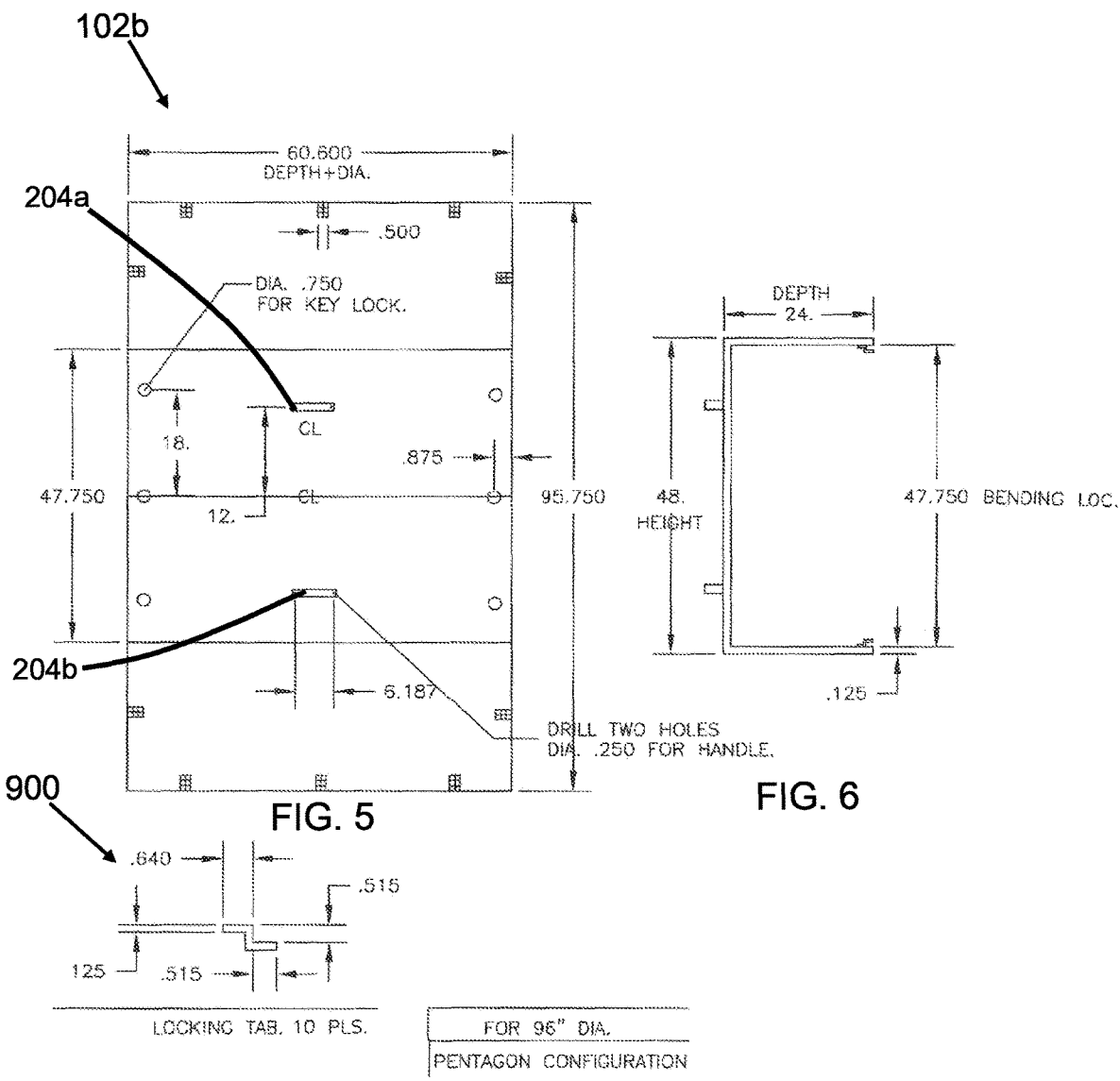

As illustrated in FIG. 7, FIG. 14 and FIG. 19, enclosures 102b, 102d and 102f contain locking tabs 900. Locking tab 900 is used to hold the edges of the walls together. Locking tab 900 has a U-shaped configuration that engages the corner of the junction between two edges of adjacent walls. Dimensions of locking tab 900 may include a Z-shaped member with length of 0.515". (See FIGS. 7, 14 and 19). FIG. 19 illustrates the details of the locking tabs, which dove tail with the guide rails on 102e, which serve to secure 102f to 102e. In yet another embodiment, a handle may be utilized to enable manipulation of 102b, 1-2d, and 102f. As FIGS. 5, 12 and 17 show, handles are fitted into the handle fastening holes 204a, 204b. In one non-limiting embodiment, handle fastening holes 204a, 204b are defined by a diameter of 0.25" sized to attach a handle to the walls (See FIG. 5, FIG. 12, and FIG. 17). However, handle may be affixed to front wall through other fastening means.

In conclusion, assembly 100 and 500 utilize multiple weatherproof enclosures [102a-102b], [102c-102d], [102e-102f] that are configured to store electronic and non-electronic equipment. Enclosures [102a-102b], [102c-102d], [102e-102f], have a modular configuration that enables the enclosures to detachably attach to each other in multiple arrangements and in series. Enclosures [102a-102b], can also mount to a vertical pole or column 106 while attached to each other, or in a spaced-apart arrangement. Enclosures

[102c-102d], [102e-102f], detachably attach in either: a two-sided, three-sided, or four-sided modular arrangement, in which any wall of any enclosure can join to an adjacent wall or the pole or column 106.

As FIGS. 3, 10 and 15 show enclosures 102a, 102c, and 102e, are defined by mounting surface that can have multiple mounting holes 201a-d to mount the enclosures around any diameter FIG. 9A, with right and left side walls, that can feature inter-connecting apertures 204a, 204b, and 202a-d, that can be mirrored to enable enclosures to be attached together. Said inter-connecting apertures are sized to enable passage of conduit, wires or pipes for electronic and non-electronic equipment. FIGS. 5, 12 and 17, are defined by a front, top and bottom sides, which have provisions for handles 204a and 204b, key locks, and locking tabs that slide over the glide rails 200a-c of 102a, 102c and 102e, which enables 102b, 102d and 102f to complete the configuration of a six-sided enclosure by joining with 102a, 102c and 102e. These enclosures can easily attach together in any geometric modular configuration.

Since many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What I claim is:

1. A modular electrical equipment storage assembly, the assembly comprising:
    multiple enclosures defined by a mounting surface, right and left side walls, the mounting surface being hingedly joined with the side walls,
    whereby a front panel articulates between an open position and a closed position;
    at least one of the side walls and the mounting surface have multiple mount holes, and inter-connecting apertures wherein the mount holes and inter-connecting apertures are configured in a mirror arrangement on the side and mounting walls, the front panel completes the three-sided enclosure defining a secured cavity being sized and dimensioned to contain electrical and non-electrical equipment and weather sensitive equipment;
    a handle fitted into handle fastening holes, the handle configured to enable manipulation of the front panel; and
    at least one fastening mechanism configured to pass through the mount holes,
    whereby the enclosures detachably attach to each other in a continuous modular arrangement, whereby the enclosures comprising at least one connecting member joined to the sidewalls of adjacent spaced apart enclosures;
    whereby the enclosures detachably attach circumferentially to a vertical pole, tower, or column of any diameter, whereby the enclosures detachably attach to each other, and to the pole or column, simultaneously, and
    whereby the continuous modular arrangement of the enclosures allows for a passage of conduit, wires or pipes through the inter-connecting apertures.

2. The assembly of claim 1, wherein the enclosures have a rectangular shape.

3. The assembly of claim 1, wherein the mounting surface has a threshold thickness for structural integrity.

4. The assembly of claim 1, wherein the fastening mechanism comprises a self-taping screw.

5. The assembly of claim 1, wherein the enclosure has a length of 60.6" and a width of 24".

6. The assembly of claim 1, further comprising a plate disposed to abut the mounting surface in a parallel relationship.

7. The assembly of claim 1, wherein the connecting member comprises a stabilizer and wire connection unit.

8. The assembly of claim 1, further comprising a locking tab.

9. The locking tab of claim 8, wherein the locking tab has a U-shaped configuration that engages the corner of the junction between two edges of adjacent walls.

10. A modular electrical equipment storage assembly, the assembly comprising:
    multiple enclosures defined by a mounting surface, right and left side walls, the mounting surface being hingedly joined with the side walls,
    whereby a front panel articulates between an open position and a closed position;
    at least one of the side walls and the mounting surface have multiple mount holes, and inter-connecting apertures wherein the mount holes and inter-connecting apertures are configured in a mirror arrangement on the side and mounting walls, the front panel completes the three-sided enclosure defining a secured cavity being sized and dimensioned to contain electrical and non-electrical equipment and weather sensitive equipment;
    a handle fitted into handle fastening holes, the handle configured to enable manipulation of the front panel; and
    at least one fastening mechanism configured to pass through the mount holes,
    whereby the enclosures detachably attach to each other in a continuous modular arrangement at an acute angle,
    whereby the enclosures detachably attach circumferentially to a vertical pole, tower, or column of any diameter, whereby the enclosures detachably attach to each other, and to the pole or column, simultaneously, and
    whereby the continuous modular arrangement of the enclosures allows for a passage of conduit, wires or pipes through the inter-connecting apertures.

* * * * *